United States Patent
Sundstrom

(10) Patent No.: US 7,476,570 B2
(45) Date of Patent: Jan. 13, 2009

(54) SYSTEM AND METHOD OF ATTACHING AN INTEGRATED CIRCUIT ASSEMBLY TO A PRINTED WIRING BOARD

(75) Inventor: Lance L. Sundstrom, Pinellas Park, FL (US)

(73) Assignee: Honeywell International Inc., Morristown, NJ (US)

( * ) Notice: Subject to any disclaimer, the term of this patent is extended or adjusted under 35 U.S.C. 154(b) by 274 days.

(21) Appl. No.: 11/381,290

(22) Filed: May 2, 2006

(65) Prior Publication Data
US 2007/0259480 A1 Nov. 8, 2007

(51) Int. Cl.
*H01L 21/00* (2006.01)
(52) U.S. Cl. .......................... 438/118; 438/125; 257/782
(58) Field of Classification Search .................. 438/107, 438/109, 110, 118, 125; 257/686, 77, 782, 257/783, 698, 777
See application file for complete search history.

(56) References Cited

U.S. PATENT DOCUMENTS

| | | | |
|---|---|---|---|
| 5,639,389 A | 6/1997 | Schmidt et al. | |
| 5,729,897 A | 3/1998 | Schmidt et al. | |
| 6,163,462 A | 12/2000 | Buck | |
| 6,323,066 B2 * | 11/2001 | Lai et al. | 438/122 |
| 6,335,491 B1 | 1/2002 | Alagaratnam et al. | |
| 6,414,248 B1 | 7/2002 | Sundstrom | |
| 6,657,134 B2 | 12/2003 | Spielberger et al. | |
| 6,723,927 B1 | 4/2004 | Fan et al. | |
| 6,791,035 B2 | 9/2004 | Pearson et al. | |
| 2003/0102156 A1 | 6/2003 | Spielberger et al. | |
| 2005/0168961 A1 * | 8/2005 | Ono et al. | 361/784 |
| 2006/0292824 A1 * | 12/2006 | Beyne et al. | 438/455 |
| 2008/0032450 A1 * | 2/2008 | Huang | 438/108 |

OTHER PUBLICATIONS

Dyconex Ltd., Dyconex Advanced Circuit Technology, p. 3, Published in: Basserdorf, Switzerland (Sep. 7, 2004).

* cited by examiner

*Primary Examiner*—S. V Clark
(74) *Attorney, Agent, or Firm*—Fogg & Powers LLC

(57) ABSTRACT

A method of coupling an integrated circuit (IC) assembly to a printed wiring board (PWB) is provided. The method comprises applying a solder paste to at least one IC assembly interfacial attach pad having a first size on a surface of the IC assembly and applying a solder paste to at least one PWB interfacial attach pad having a second size on a surface of the PWB. The method also comprises reflow attaching the at least one IC assembly interfacial attach pad to the at least one PWB interfacial attach pad, wherein the difference between the size of the at least one PWB interfacial attach pad and the size of the at least one IC assembly interfacial attach pad substantially inhibits self-alignment and lift-off forces.

20 Claims, 7 Drawing Sheets

SYSTEM AND METHOD OF ATTACHING AN INTEGRATED CIRCUIT ASSEMBLY TO A PRINTED WIRING BOARD

BACKGROUND

As the switching speed (edge rates) and the number of input/outputs (I/O) of an integrated circuit (IC) assembly increase, the number of outputs that can switch synchronously (simultaneously in the same direction) also increase. An IC assembly can include one or more IC die and discrete components in and/or on an IC package. This results in switching currents in the power and ground paths with larger peak magnitudes and rates of change (di/dt). These large switching current peaks and rates of change generate voltages across the series resistance (V=R*i) and inductance (V=Ldi/dt) of the power and ground paths between the IC die inside the IC package and its host printed wiring board (PWB). These power and ground paths may include bond wire, trace, via and lead paths. The voltages developed across these power and ground paths leads to fluctuations in the power and ground voltages at the IC die relative to those of its host PWB, commonly referred to as rail bounce. As operating voltages decrease, rail bounce tolerance also decreases.

To reduce IC rail bounce in common IC assemblies, interfacial power and ground attach pads are added to the bottom of the IC assembly and bypass capacitor attach pads are added to the top of the IC assembly. When soldered to a mating attach pad on PWB, a single interfacial path can have a much lower series resistance and inductance than multiple parallel peripheral lead paths.

The adhesive force that causes liquid solder to spread across a metal surface is commonly referred to as whetting. The cohesive force that causes liquid solder to pull into a shape with minimum surface area (e.g. a sphere) is commonly referred to as surface tension. The combined effect of adhesive and cohesive forces will cause liquid solder to flow into a dome shape (a portion of a sphere) on a single circular pad. When identical interfacial pads are soldered together, the combined effect of adhesive and cohesive forces tends to pull these pads into alignment to form a vertical solder column. The solder column height is defined by the solder volume and the pad area.

IC package manufacturing and assembly tolerances (e.g. location of top IC assembly lead frame attach pads relative to bottom PWB interfacial attach pads) together with IC/PWB assembly tolerances (e.g. forming and shearing of peripheral leads and part placement) can buildup to cause variations in the PWB interface of an IC/PWB assembly. These include variations in the gap between the IC assembly interfacial attach pads and the seating plane of formed and sheared peripheral leads. These variations also include variations in the positions of one or more PWB interfacial attach pads relative to the formed and sheared peripheral leads. The PWB footprint is designed around the nominal positions of the IC assembly interfacial attach pad and formed and sheared peripheral leads. These variations due to manufacturing and assembly tolerances can cause various negative effects on the IC/PWB assembly processes and on the performance and reliability of IC/PWB assemblies. To better understand the present invention further background of the problems caused by manufacturing and assembly tolerances are described in relation to FIGS. 1A-1C.

For the reasons stated above, and for other reasons stated below which will become apparent to those skilled in the art upon reading and understanding the present specification, there is a need in the art for a system and method to alleviate the adverse effects of variations in package manufacturing tolerances and assembly tolerances.

SUMMARY

The above-mentioned problems and other problems are resolved by the present invention and will be understood by reading and studying the following specification.

In one embodiment, a method of coupling an integrated circuit (IC) assembly to a printed wiring board (PWB) is provided. The method comprises applying a solder paste to at least one IC assembly interfacial attach pad having a first size on a surface of the IC assembly and applying a solder paste to at least one PWB interfacial attach pad having a second size on a surface of the PWB. The method also comprises reflow attaching the at least one IC assembly interfacial attach pad to the at least one PWB interfacial attach pad, wherein the difference between the size of the at least one PWB interfacial attach pad and the size of the at least one IC assembly interfacial attach pad substantially inhibits self-alignment and lift-off forces.

In another embodiment, a method of manufacturing an integrated circuit (IC) assembly and a printed wiring board (PWB) is provided. The method comprises forming at least one interfacial attach pad having a first size on a first surface of an integrated circuit assembly and forming at least one mating interfacial attach pad having a second size on a surface of a printed wiring board.

In yet another embodiment, an integrated circuit/printed wiring board assembly is provided. The integrated circuit/printed wiring board comprises an integrated circuit (IC) assembly having at least one IC assembly interracial attach pad on a first surface of the IC assembly; and a printed wiring board (PWB) coupled to the integrated circuit assembly. The PWB has at least one PWB interfacial attach pad on a surface of the PWB, wherein the size of the at least one PWB interfacial attach pad is sufficiently different from the size of the at least one IC assembly interfacial attach pad that self-alignment and lift-off forces between the at least one IC assembly interfacial attach pad and the at least one PWB interfacial attach are substantially inhibited when the interfacial attach pads are attached.

DRAWINGS

The present invention can be more easily understood and further advantages and uses thereof more readily apparent, when considered in view of the description of the preferred embodiments and the following figures in which.

DETAILED DESCRIPTION

Figure 1A:
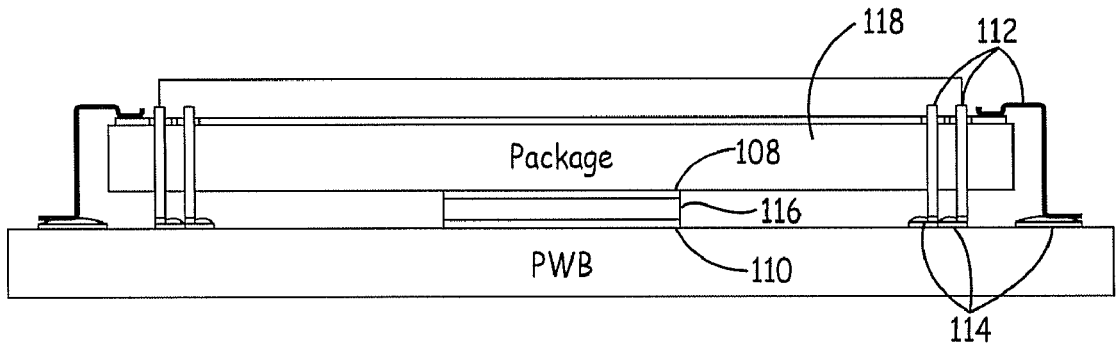
FIGS. 1A-1C are a series of diagrams illustrating problems of prior art integrated circuit/printed wiring board assemblies.

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. It should be understood that the exemplary method illustrated may include additional or fewer steps or may be performed in the context of a larger processing scheme. Furthermore, the methods presented in the drawing figures or the specification are not to be construed as limiting the order in which the individual steps may be performed. The following detailed description is, therefore, not to be taken in a limiting sense.

Figure 2A:
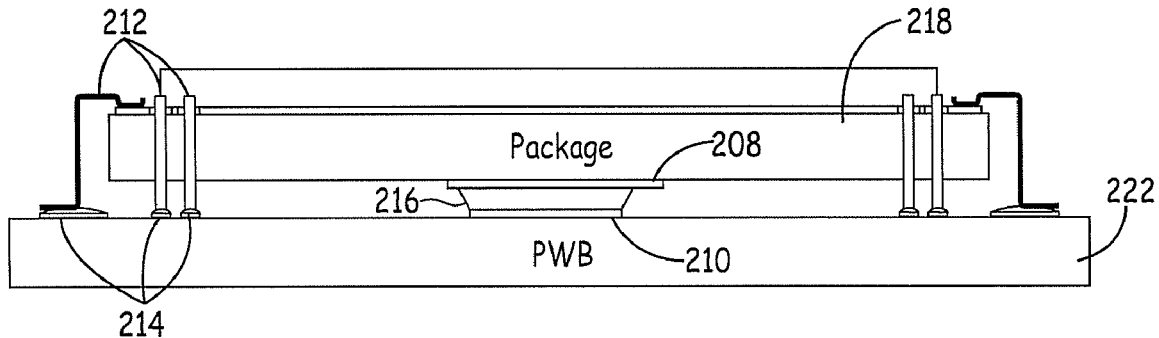
FIGS. 2A-2C are a series of diagrams illustrating integrated circuit/printed wiring board assemblies according to embodiments of the present invention.
Figure 2B:
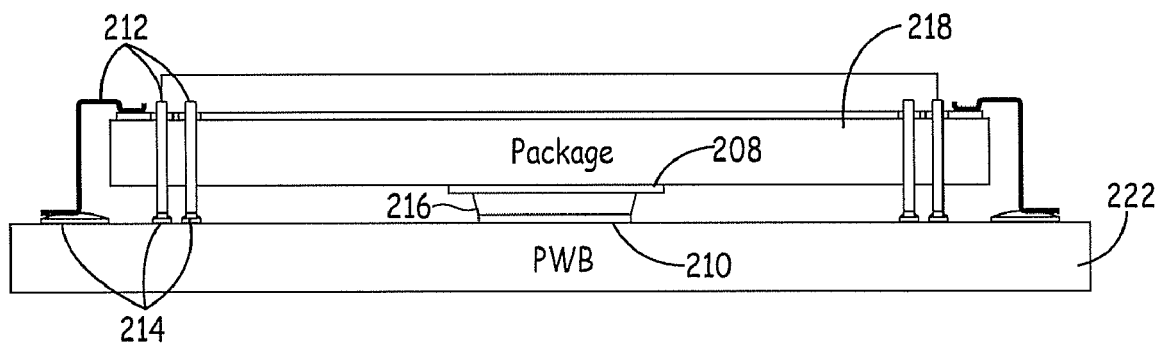
Figure 2C:
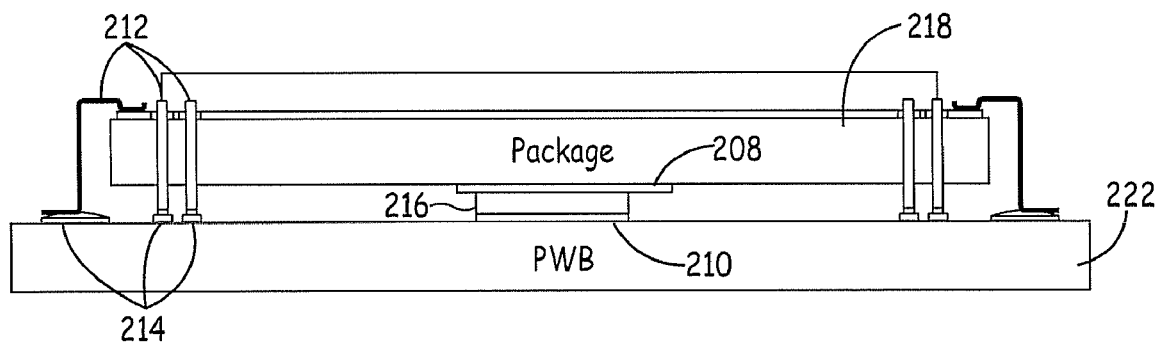

Embodiments of the present invention substantially inhibit self-alignment forces between interfacial attach pads on a printed wiring board (PWB) and an integrated circuit (IC) assembly (as used herein the term IC assembly includes both one or more packaged ICs and one or more packaged ICs coupled to an interposer). By inhibiting the self-alignment forces, embodiments of the present invention help alleviate the adverse effects of the self-alignment forces in the presence of package manufacturing tolerances and assembly tolerances. Embodiments of the present invention also accommodate variations in the solder volume and the gap between IC assembly and PWB interfacial attach pads without adverse affects on the IC/PWB assembly processes or on the performance and reliability of the IC/PWB assembly. FIGS. 2A-2C depict the resistance of embodiments of the present invention to these adverse effects in different situations involving package manufacturing tolerances and assembly tolerances.

Figure 1B:
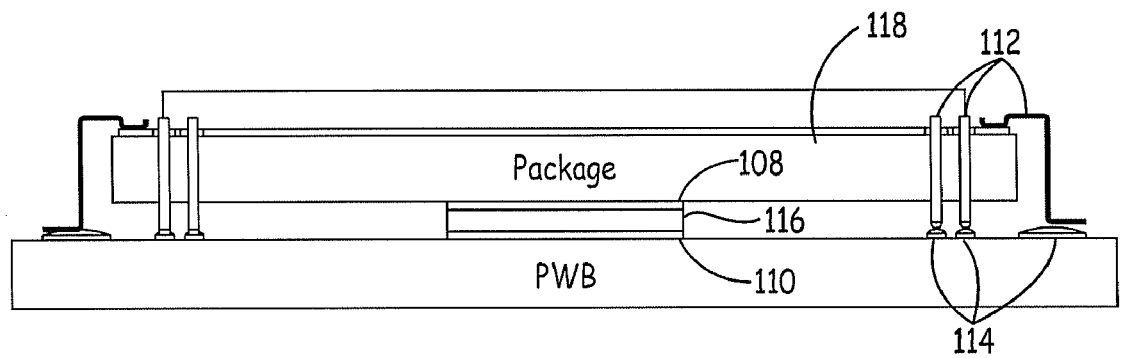
Figure 1C:
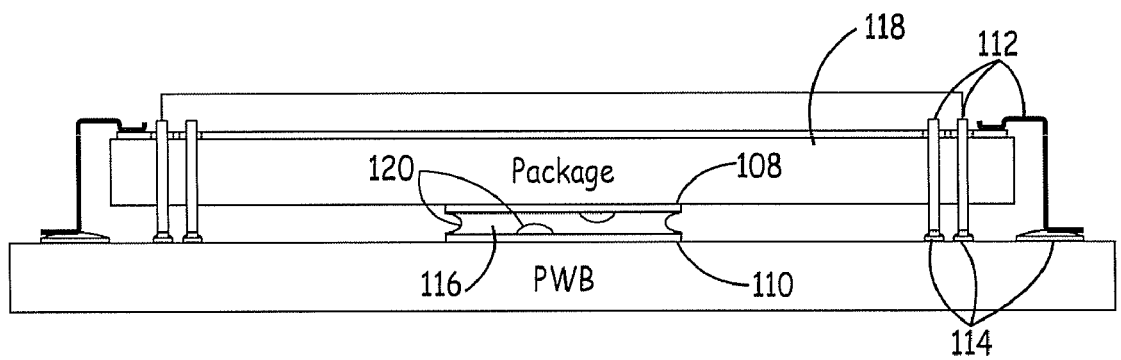

FIGS. 1A-1C depict how manufacturing and assembly tolerances can affect the IC/PWB assembly and component performance and reliability. For purposes of explanation, each of IC/PWB assemblies shown in FIGS. 1A-1C are shown with center facing leads removed for a view of the center interfacial bond between IC assembly interfacial attach pad 108 and the PWB interfacial attach pad 110. FIG. 1A depicts the possible effect of an IC assembly interfacial attach pad 108 offset relative to peripheral leads 112. The self-aligning forces between IC assembly interfacial attach pad 108 and PWB interfacial attach pad 110 can pull peripheral leads 112 out of alignment with their PWB attach pads 114. In this example, the solder volume is correct for the interfacial attach pad size and gap.

FIG. 1B depicts the possible effect of too much solder between interfacial attach pads 108 and 110. The excess solder 116 can cause IC assembly 118 to float and lift one or more peripheral leads 112 off their PWB attach pads 114. Finally, FIG. 1C depicts the possible effect of too little solder between interfacial attach pads 108 and 110. When too little solder 116 is present, the solder column is incomplete and voids 120 can form between interfacial attach pads 108 and 110. These voids adversely affect component performance and reliability due to the incomplete interface between attach pads 108 and 110.

FIGS. 2A-2C are a series of diagrams illustrating integrated circuit/printed wiring board (IC/PWB) assemblies according to embodiments of the present invention. As can be seen, IC assembly interfacial attach pad 208 is a different size than PWB interfacial attach pad 210 in FIGS. 2A-2C. In particular, IC assembly interfacial attach pad 208 is larger than PWB interfacial attach pad 210 in FIGS. 2A-2C. Making the PWB interfacial attach pad 210 smaller leaves more room for surface traces and via pads on PWB 222 under IC assembly 218. However, in other embodiments, PWB interfacial attach pad 210 is larger than IC assembly interfacial attach pad 208.

IC assembly interfacial attach pad 208 is offset relative to leads 212 in FIG. 2A. However, unlike in FIG. 1A, self-aligning forces do not cause leads 212 to be pulled out of alignment with their PWB lead attach pads 214. Moreover, when excess solder 216 is applied between IC assembly interfacial attach pad 208 and PWB interfacial attach pad 210 as illustrated in FIG. 2B, it does not cause IC assembly 218 to float and lift one or more peripheral leads 212 off their respective PWB lead attach pads 214, as shown in FIG. 1B. Finally, if too little solder 216 is applied between IC assembly interfacial attach pad 208 and PWB interfacial attach pad 210, as illustrated in FIG. 2C, voids are not formed in solder 216, like in FIG. 1C.

Embodiments of the present invention are able to substantially resist the adverse effects of IC package manufacturing and assembly tolerances and IC/PWB assembly tolerances due, in part, to the difference in size between IC assembly interfacial attach pad 208 and PWB interfacial attach pad 210. Notably, although only one IC assembly interfacial attach pad 208 and one PWB interfacial attach pad 210 are depicted in FIGS. 2A-2C, embodiments of the present invention are not intended to be so limited. In particular, in other embodiments, more than one PWB interfacial attach pad 210 and more than one IC assembly interfacial attach pad 208 are used. In some such embodiments, the number and position of PWB interfacial attach pads 210 is equal to the number and position of IC assembly interfacial attach pads 208. Alternatively, in other such embodiments, IC assembly 218 has multiple interfacial attach pads 208 and a mating PWB interfacial attach pad 210 is designed to utilize one of the IC assembly interfacial attach pads 208. This provides multiple interfacial attachment options. In such embodiments, PWB 222 has fewer interfacial attach pads 210 than IC assembly 218.

The position and shape of the periphery of solder column 216 at the smaller of interfacial attach pads 208 and 210 is defined by the position and shape of the periphery of the smaller interfacial attach pad. In this example, PWB interfacial attach pad 210 is the smaller interfacial attach pad. The position and shape of the periphery of solder column 216 at the larger IC assembly interfacial attach pad 208 is defined by the position and shape of the periphery of smaller PWB interfacial attach pad 210, the gap between IC assembly interfacial attach pad 208 and PWB interfacial attach pad 210, and the available volume of solder to form solder column 216. Interfacial attach pads 208 and 210, in this example, are designed so that IC assembly interfacial attach pad 208 is large enough that the periphery of the solder column 216 formed at IC assembly interfacial attach pad 208 is well within the periphery of IC assembly interfacial attach pad 208 under substantially all conditions.

The size of the larger IC assembly interfacial attach pad 208 is chosen, in this example, to accommodate the largest solder column 216 periphery at the IC assembly interfacial attach pad 208 based on assuming a minimum gap and maximum solder volume with the worst case offset between IC assembly and PWB interfacial attach pads 208 and 210. Since the volume of solder in solder column 216 is sufficient to reach the periphery of the smaller PWB interfacial attach pad 210, but not the periphery of the larger IC assembly interfacial attach pad 208, substantially no lateral self-alignment forces are generated between IC assembly interfacial attach pad 208 and PWB interfacial attach pad 210. Also, since the larger IC assembly interfacial attach pad 208 provides room for solder column 216 to adjust its shape to variations in gap and solder volume, no liftoff forces or voiding occurs. In FIGS. 2A-2C, the shape of solder column 216 varies from a vertical truncated cone (at minimum gap and maximum solder volume as shown in FIG. 2A) to a vertical cylinder (at maximum gap and minimum solder volume as shown in FIG. 2C). In this example, a circular or oval cross section is used rather than a rectangular cross section for solder column 216. A circular or oval cross section has a lower probability of crack initiation and propagation than a rectangular cross section. In addition, the method of attaching IC assembly 218 to PWB 222 helps ensure proper attachment and formation of void-free solder columns. Exemplary embodiments of methods of attachment are described below with regards to FIGS. 3-6.

Figure 3:
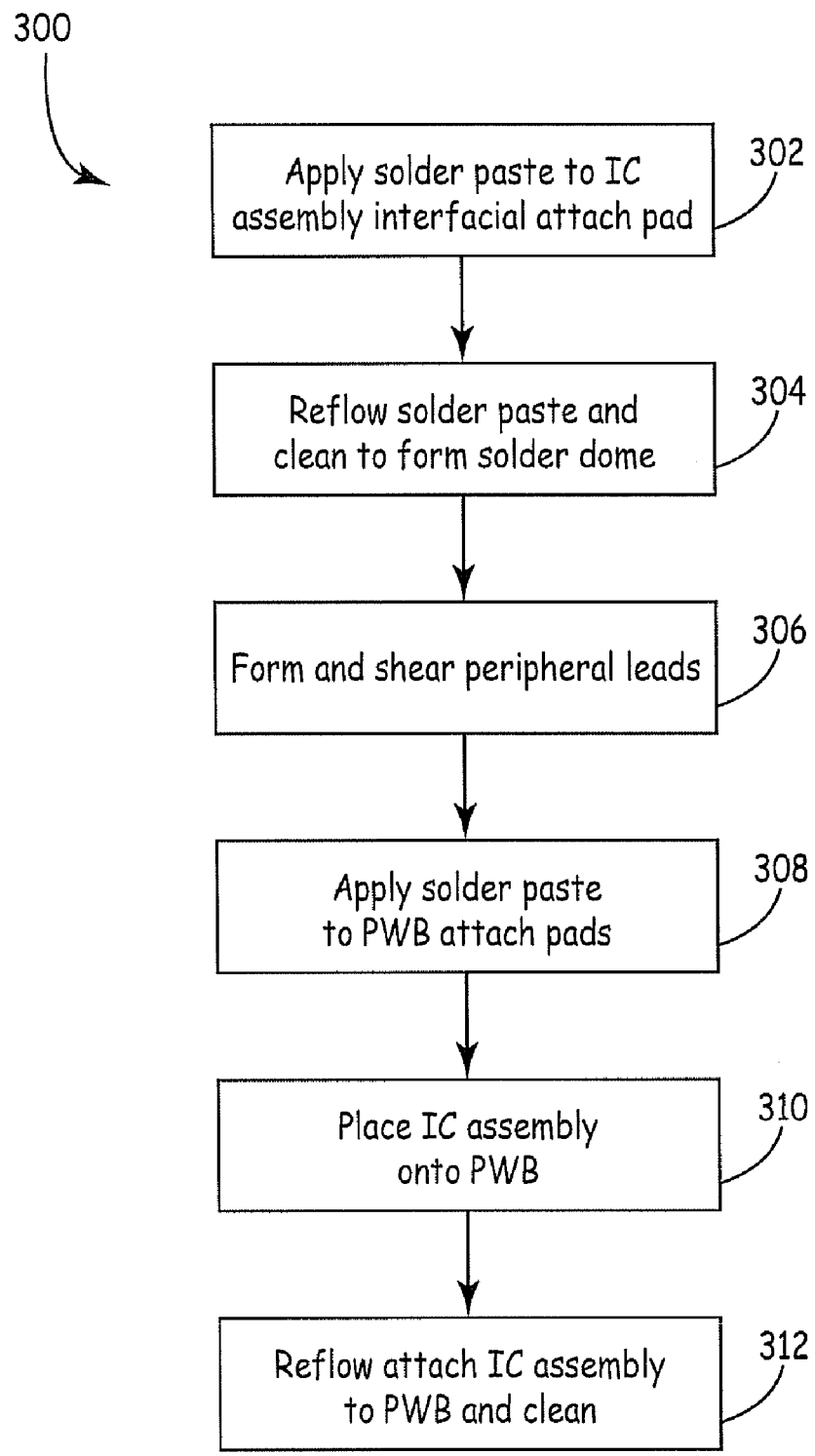
FIG. 3 is a flow chart showing a method of attaching an integrated circuit assembly and a printed wiring board according to one embodiment of the present invention.

FIG. 3 is a method 300 of attaching an IC assembly and a PWB according to one embodiment of the present invention. At 302, solder paste is initially dispensed, screened or stenciled onto at least one IC assembly interfacial attach pad on a surface of the IC assembly (See solder 416 and IC assembly interfacial attach pad 408 in FIG. 4A). At 304, the solder paste is reflowed and cleaned to form a solder dome (See solder dome 416 in FIG. 4B). The solder dome height is designed to be less than or equal to the minimum gap between the between the at least one IC assembly interfacial attach pad and at least one PWB interfacial attach pad. The gap is also the distance between the at least one IC assembly interfacial attach pad and the seating plane of its formed and sheared peripherals leads. Therefore, limiting the solder dome height to this minimum gap distance helps ensure that the solder dome does not interfere with the placement and contact of the peripheral leads on their respective PWB lead attach pads.

Figure 4A:
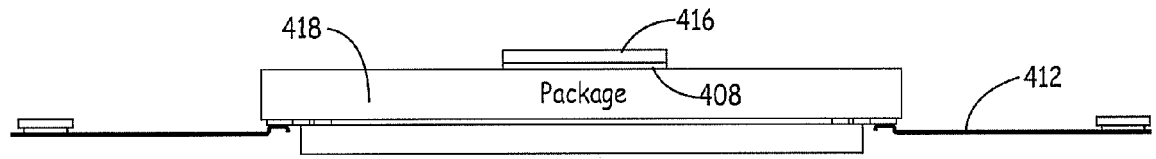
FIGS. 4A-4E are a series of diagrams illustrating a process of attaching an integrated circuit assembly to a printed wiring board according to embodiments of the present invention.
Figure 4B:
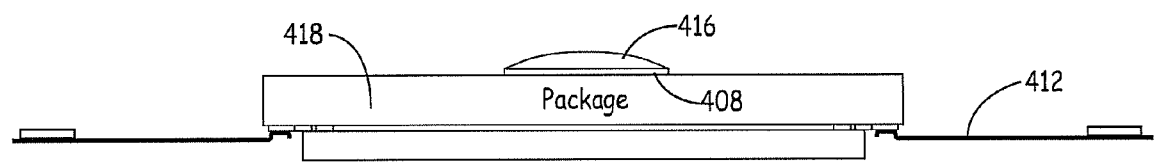
Figure 4C:
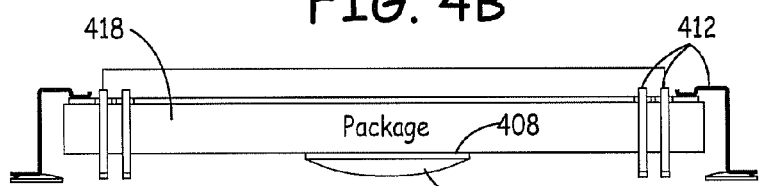
Figure 4D:
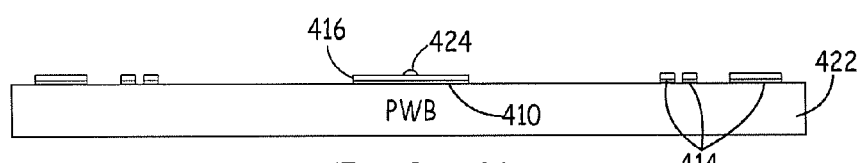
Figure 4E:
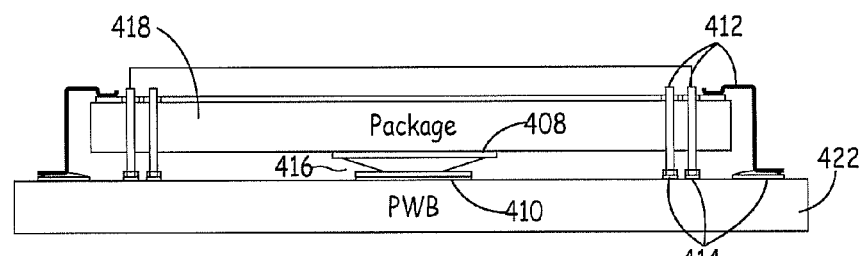

At 306, the peripheral leads are formed and sheared (See leads 412 in FIG. 4C). At 308, solder paste is screened, stenciled or dispensed onto at least one PWB interfacial attach pad and a plurality of PWB lead attach pads (See solder 416 and PWB interfacial attach pad 410 and PWB lead attach pads 414 in FIG. 4D). In addition, in this example, an additional solder dot is dispensed onto the center of the at least one PWB interfacial attach pad (see solder dot 424 in FIG. 4D). The solder dot helps ensure the formation of a solder paste bridge even with a minimum solder dome height on the at least one IC assembly interfacial attach pad and a maximum gap between the IC assembly and PWB interfacial attach pads (see IC assembly and PWB interfacial attach pads 408 and 410 in FIG. 4D). At 310, the IC assembly is placed onto the PWB so that the peripheral leads are aligned with their respective PWB lead attach pads. (See leads 412 and PWB lead attach pads 414 in FIG. 4E). The solder dome helps bridge the gap between the IC assembly and PWB interfacial pads.

At 312, the IC assembly is reflow attached to the PWB and cleaned. The solder dome shape promotes reliable solder column formation from its center outward, which in turn helps inhibit formation of voids (also known as voiding). The at least one IC assembly interfacial attach pad and the at least one PWB interfacial pad are of different sizes. In particular, in this example, the at least one IC assembly interfacial attach pad is larger than the at least one PWB interfacial attach pad. However, it is to be understood that in other embodiments, other configurations are used. For example, in one exemplary embodiment involving a plurality of PWB and IC assembly interfacial attach pads, some of the PWB interfacial attach pads are larger than their mating IC assembly interfacial attach pads and some of the IC assembly interfacial attach pads are larger than their mating PWB interfacial attach pads. The solder at the periphery of the larger interfacial attach pad provides substantially the volume of solder necessary to form the interfacial solder column.

As the domed solder on the IC assembly interfacial attach pad and the solder paste on the PWB interfacial attach pad melt, the solder flows into an interfacial solder column. As explained above, the difference in size between the IC assembly and PWB interfacial attach pads helps alleviate adverse effects of self-alignment and liftoff forces in the presence of manufacturing and assembly tolerances. Examples of the resulting interfacial solder column and IC/PWB assembly produced according to method 300 are shown above in FIGS. 2A-2C. As described above, the IC/PWB assembly produced according to method 300 substantially inhibits self-alignment and liftoff forces under substantially all conditions (e.g. too little/much solder, too little/much gap, misalignment of attach pads, etc.).

Figure 5:
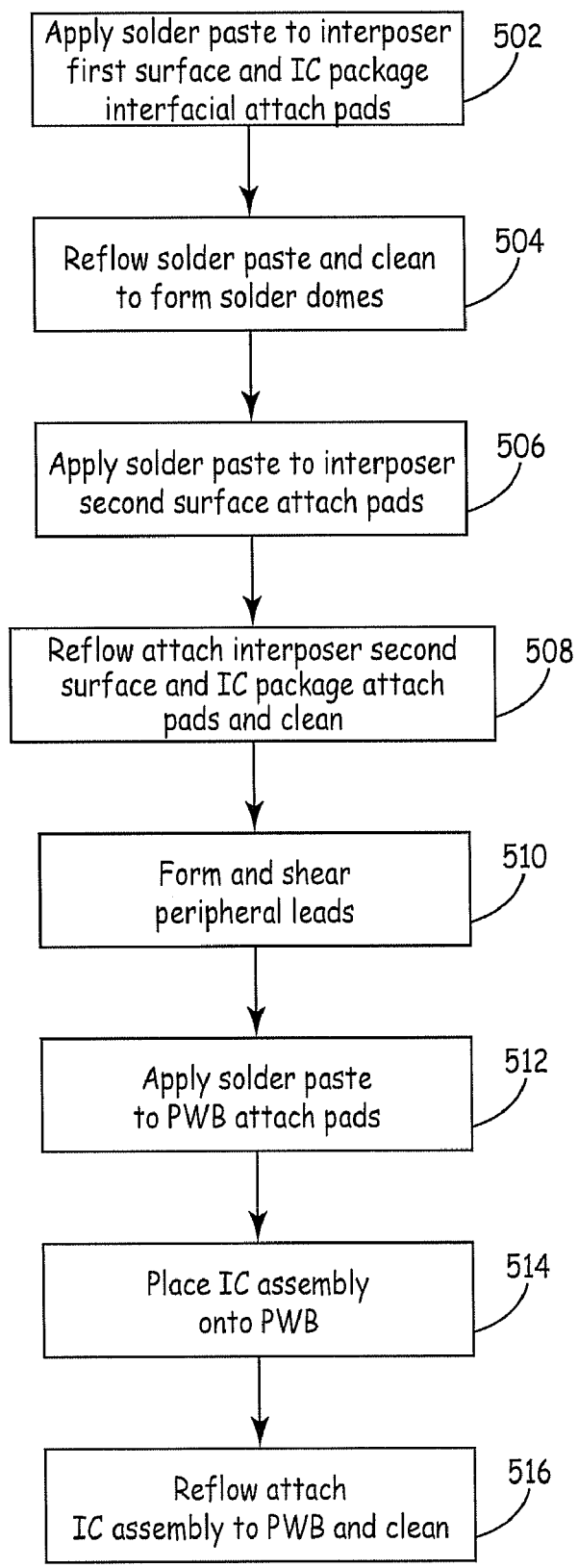
FIG. 5 is a flow chart showing a method of attaching an integrated circuit assembly with an interposer to a printed wiring board according to one embodiment of the present invention.

FIG. 5 is another method 500 of attaching an IC assembly and a PWB according to one embodiment of the present invention. In particular, method 500 is useful for devices needing multiple compliant interfacial power and ground connections to control rail bounce. The IC assembly in this example includes one or more packaged ICs coupled to an interposer. At 502, solder paste is dispensed, stenciled or screened onto at least one interfacial attach pad on each of a first surface of an interposer and a surface of an IC package (see interfacial attach pads 609 on first surface 611 of interposer 626 and interfacial attach pads 608 on surface 613 of IC package 618 in FIG. 6A). An interposer is used to absorb interfacial distortions. For example, when more than a single center interfacial connection is needed, the thermal coefficient of expansion (TCE) mismatch between the IC assembly materials and the PWB materials must be considered. In addition, the distortions of the interface due to PWB flexure under acceleration, vibration, and mechanical shock also must be considered. The interfacial solder columns provide little compliance and will typically fail with repeated thermal cycling, acceleration, vibration and mechanical shock. One compliant interposer that can absorb these distortions is the Honeywell, Inc. interposer described in co-pending U.S. patent application Ser. No. 11/254,512 filed on Oct. 20, 2005.

Therefore, in this example, an interposer is first attached to an IC package (see interposer 626 and IC package 618 in FIGS. 6A-6G). At 504, the solder paste on interfacial attach pads of the interposer first surface and the IC package is reflowed and cleaned to form solder domes (see solder domes 616 on interfacial attach pads 609 on first surface 611 of interposer 626 and on interfacial attach pads 608 on surface 613 of IC package surface 618 in FIG. 6B). At 506, solder paste is dispensed, stenciled or screened onto at least one interfacial attach pad on the interposer second surface (see interfacial attach pad 607 on second surface 615 of interposer 626 in FIG. 6C). The number and position of interposer second surface interfacial attach pads matches the number and position of IC package interfacial attach pads in this example. However, it is to be understood that, in other embodiments, the number of interposer second surface interfacial attach pads does not match the number of IC package interfacial attach pads.

Figure 6A:
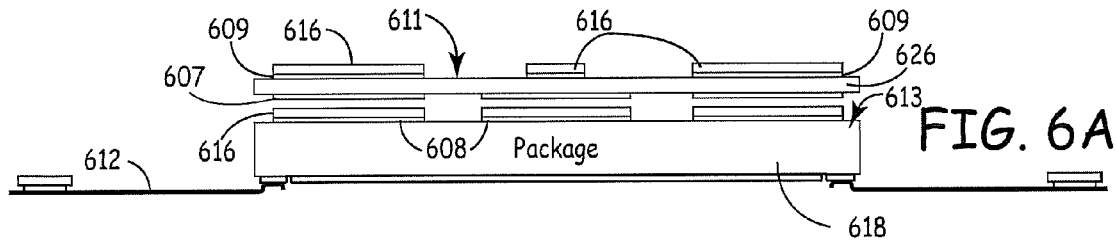
FIGS. 6A-6G are a series of diagrams illustrating a process of attaching an integrated circuit assembly with an interposer to a printed wiring board according to embodiments of the present invention.
Figure 6B:
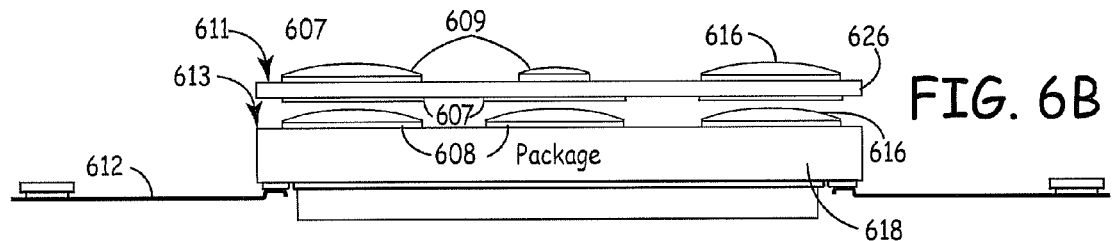
Figure 6C:
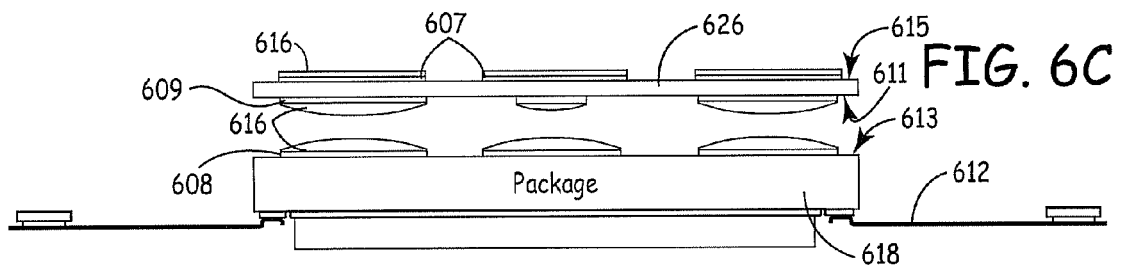
Figure 6D:
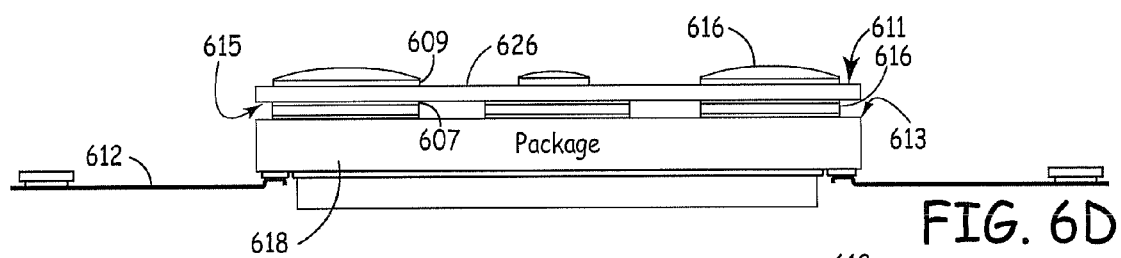

At 508, the interposer second surface and IC package interfacial attach pads are reflow attached and cleaned forming a solder column between the respective interposer second surface and IC package interfacial attach pads (see FIG. 6D). In this example, the interposer second surface and IC package interfacial attach pads are substantially the same size promoting self-alignment of the interposer and IC package. However, in other embodiments, the interposer second side and IC package interfacial attach pads are different sizes in order to substantially inhibit self-alignment forces. In addition, although the solder in this example was shaped into a dome on the interposer first surface and the IC package, it is to be understood that in other embodiments other configurations are used. For example, alternatively, the solder on the interposer second surface interfacial attach pads are shaped into a dome rather than the solder on the IC package interfacial pads.

Figure 6E:
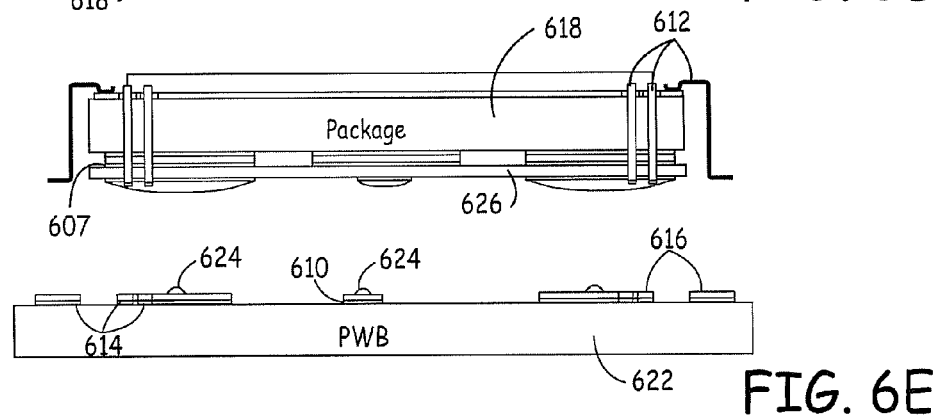

At 510, the peripheral leads of the IC assembly are formed and sheared (See leads 612 in FIG. 6E). At 512, solder paste is screened, stenciled or dispensed onto at least one PWB interfacial attach pad and a plurality of PWB lead attach pads (See solder 616 and PWB interfacial attach pad 610 and PWB lead attach pads 614 in FIG. 6E). The number of PWB interfacial attach pads is equal to the number of interposer first surface interfacial attach pads, in this example. However, it is to be understood that in other embodiments, the number of interposer first surface interfacial attach pads and PWB interfacial attach pads are not the same. In addition, in this example, an additional solder dot is dispensed onto the center of the at least one PWB interfacial attach pad (see solder dots 624 in FIG. 6E). The solder dot helps ensure the formation of a solder paste bridge even with a minimum solder dome height on the at least one interposer first surface interfacial attach pad and a maximum gap between the interposer first surface and PWB interfacial attach pads. However, it is to be understood that in other embodiments, the additional solder dot is not used.

Figure 6F:
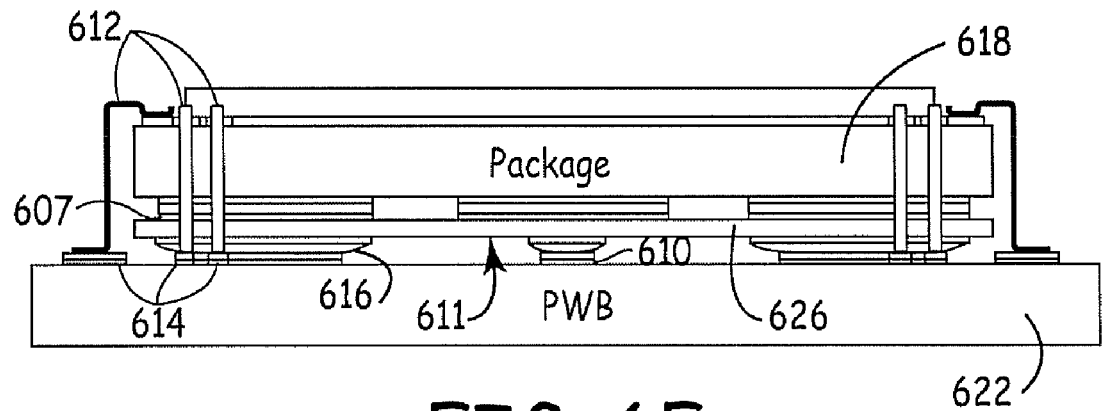
Figure 6G:
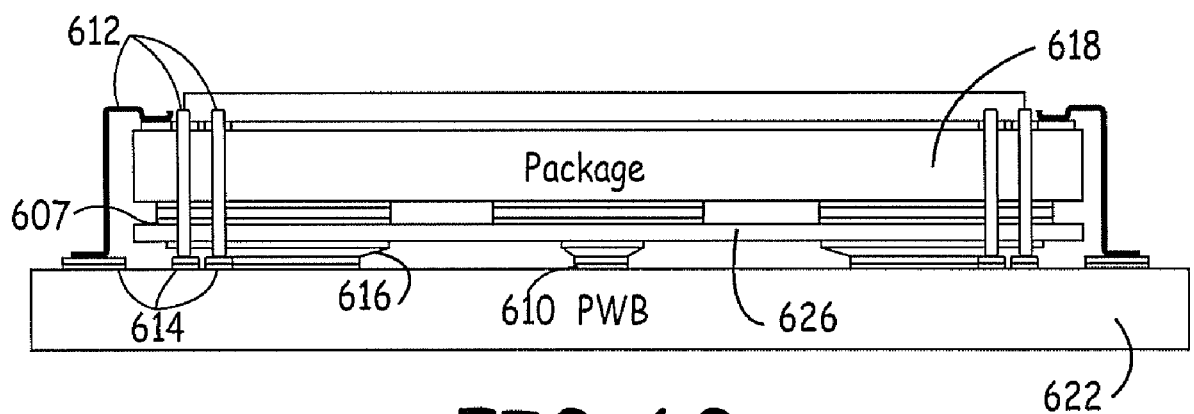

At 514, the IC assembly is placed onto the PWB with the peripheral leads aligned to their respective PWB lead attach pads (see FIG. 6F). The interposer first surface solder dome helps bridge the gap between the interposer first surface and PWB interfacial attach pads. At 516, the IC assembly is reflow attached to the PWB and cleaned (see FIG. 6G). The solder dome shape on the interposer first surface interfacial attach pads promotes reliable solder column formation from its center outward, which in turn helps inhibit voiding. The size of the at least one interposer first surface interfacial attach pad is different from the size of the at least one PWB interfacial attach pad. The solder at the periphery of the larger interposer first surface interfacial attach pad provides substantially the volume of solder necessary to form the interfacial solder column. As can be seen in FIGS. 6E and 6F, the at least one interposer first surface interfacial attach pad is larger than the at least one PWB interfacial attach pad in this example. As explained above, this difference in size helps alleviate adverse effects of self-alignment and liftoff forces in the presence of adverse manufacturing and assembly tolerances. Although the interposer first surface interfacial attach pad is larger in this example, it is to be understood that in other embodiments, other configurations are used. For example, alternatively, the at least one PWB interfacial attach pad is larger than the at least one interposer first surface interfacial attach pad.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method of coupling an integrated circuit (IC) assembly to a printed wiring board (PWB), the method comprising:

applying a solder paste to at least one IC assembly interfacial attach pad having a first size on a surface of the IC assembly;

applying a solder paste to at least one PWB interfacial attach pad having a second size different from the first size on a surface of the PWB; and reflow attaching the at least one IC assembly interfacial attach pad to the at least one PWB interfacial attach pad, wherein the difference between the size of the at least one PWB interfacial attach pad and the size of the at least one IC assembly interfacial attach pad substantially inhibits self-alignment and lift-off forces.

2. The method of claim 1, wherein applying a solder paste to the at least one PWB interfacial attach pad having a second size further comprises applying a solder paste to at least one PWB interfacial attach pad having a second size that is smaller than the first size of the at least one IC assembly interfacial attach pad.

3. The method of claim 1, further comprising:

applying a solder paste dot in the center of the solder paste on the at least one PWB interfacial attach pad.

4. The method of claim 1, wherein applying a solder paste to the at least one IC assembly interfacial attach pad and applying a solder paste to the at least one PWB interfacial attach pad further comprises:

applying a solder paste to at least one rounded IC assembly interfacial attach pad; and applying a solder paste to at least one rounded PWB interfacial attach pad.

5. The method of claim 1, further comprising:

forming and shearing peripheral IC assembly leads;

applying solder to PWB lead attach pads; and aligning the peripheral IC assembly leads with the PWB lead attach pads.

6. The method of claim 1, wherein applying a solder paste to at least one IC assembly interfacial attach pad further comprises:

applying a solder paste to at least one IC assembly interfacial attach pad on a first surface of an interposer in the IC assembly.

7. The method of claim 6, further comprising:

applying a solder paste to at least one IC assembly interfacial attach pad on a surface of an IC package in the IC assembly;

applying a solder paste to at least one IC assembly interfacial attach pad on a second surface of the interposer; and reflow attaching the at least one IC assembly interfacial attach pad on the second surface of the interposer to the at least one IC assembly interfacial attach pad on the surface of the IC package.

8. The method of claim 1, wherein applying a solder paste to the at least one IC assembly interfacial attach pad further comprises:

reflowing and cleaning the solder paste on the at least one IC assembly interfacial attach pad to form a dome.

9. The method of claim 8, wherein reflowing and cleaning the solder paste on the at least one IC assembly interfacial attach pad further comprises:

reflowing and cleaning the solder paste on the at least one IC assembly interfacial attach pad such that the height of the dome does not exceed the distance of a gap between the at least one IC assembly interfacial attach pad and a seating plane of IC assembly leads.

10. A method of manufacturing an integrated circuit (IC) assembly and a printed wiring board (PWB), the method comprising:

forming at least one interfacial attach pad having a first size on a first surface of an integrated circuit assembly; and forming at least one mating interfacial attach pad having a second size on a surface of a printed wiring board;

wherein the first size of the at least one interfacial attach pad on the first surface of the IC assembly is sufficiently different from the second size of the at least one mating interfacial attach pad on the PWB that self-alignment and lift-off forces between the at least one IC interfacial attach pad and the at least one PWB mating interfacial attach pad are substantially inhibited when the interfacial attach pads are attached.

11. The method of claim 10, wherein forming at least one mating interfacial attach pad having a second size on a surface of the printed wiring board further comprises forming at least one mating interfacial attach pad having a second size smaller than the first size.

12. The method of claim 10, wherein forming at least one interfacial attach pad having a first size on a first surface of the integrated circuit assembly and forming at least one mating interfacial attach pad having a second size on a surface of the printed wiring board further comprises:

forming at least one rounded interfacial attach pad having a first size on a first surface of an integrated circuit assembly; and forming at least one mating rounded interfacial attach pad having a second size on a surface of a printed wiring board.

13. The method of claim 10, wherein forming at least one interfacial attach pad having a first size on a first surface of the integrated circuit assembly further comprises:

forming at least one interfacial attach pad on a first surface of an interposer in the integrated circuit assembly.

14. The method of claim 13, further comprising:

forming at least one interfacial attach pad on a second surface of the interposer;

forming at least one mating interfacial attach pad on a surface of an integrated circuit package; and attaching the interfacial attach pad on the second surface of the interposer to the at least one mating interfacial attach pad on a surface of the integrated circuit package.

15. An integrated circuit/printed wiring board assembly, comprising:

an integrated circuit (IC) assembly having at least one IC assembly interfacial attach pad on a first surface of the IC assembly; and a printed wiring board (PWB) coupled to the integrated circuit assembly, the PWB having at least one PWB interfacial attach pad on a surface of the PWB, wherein the size of the at least one PWB interfacial attach pad is sufficiently different from the size of the at least one IC assembly interfacial attach pad that self-alignment and lift-off forces between the at least one IC assembly interfacial attach pad and the at least one PWB interfacial attach pad are substantially inhibited when the interfacial attach pads are attached.

16. The integrated circuit/printed wiring board assembly of claim 15, wherein the integrated circuit is one of a ceramic dual flat pack and a ceramic quad flat pack.

17. The integrated circuit/printed wiring board assembly of claim 15, wherein the at least one IC assembly interfacial attach pad on the first surface of the IC assembly and the at least one PWB interfacial attach pad are rounded interfacial attach pads.

18. The integrated circuit/printed wiring board assembly of claim 15, wherein the at least one PWB interfacial attach pad is smaller than the at least one IC assembly interfacial attach pad.

19. The integrated circuit/printed wiring board assembly of claim 15, wherein the IC assembly farther comprises:

an IC package having at least one IC assembly interfacial attach pad on a surface of the IC package; and an interposer having at least one IC assembly interfacial attach pad on each of a first and second surfaces, wherein the at least one IC assembly interfacial attach pad on the second surface is coupled to the at least one IC assembly interfacial attach pad on the surface of the IC package and the at least one IC assembly interfacial attach pad on the first surface is coupled to the at least one PWB interfacial attach pad.

20. The integrated circuit/printed wiring board assembly of claim 15 prepared by a process comprising:

applying solder paste to the at least one IC assembly interfacial attach pad;

reflowing and cleaning the solder paste on the at least one IC assembly interfacial attach pad to form a dome;

applying a solder paste dot to the center of the at least one PWB interfacial attach pad;

and reflow attaching and cleaning the at least one IC assembly interfacial attach pad to the at least one PWB interfacial attach pad.

* * * * *